USO11081768B2

(12) United States Patent
Marin et al.

(10) Patent No.: US 11,081,768 B2
(45) Date of Patent: Aug. 3, 2021

(54) FABRICATING AN RF FILTER ON A SEMICONDUCTOR PACKAGE USING SELECTIVE SEEDING

(71) Applicant: Intel Corporation, Santa Clara, CA (US)

(72) Inventors: Brandon C. Marin, Chandler, AZ (US); Jeremy D. Ecton, Gilbert, AZ (US); Aleksandar Aleksov, Chandler, AZ (US); Kristof Darmawikarta, Chandler, AZ (US); Yonggang Li, Chandler, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 38 days.

(21) Appl. No.: 16/421,989

(22) Filed: May 24, 2019

(65) Prior Publication Data
US 2020/0373261 A1 Nov. 26, 2020

(51) Int. Cl.
| | |
|---|---|
| H01P 1/208 | (2006.01) |
| H01P 1/20 | (2006.01) |
| H01P 7/10 | (2006.01) |
| H01L 23/66 | (2006.01) |
| H01P 3/16 | (2006.01) |
| H01L 21/768 | (2006.01) |
| H01P 11/00 | (2006.01) |
| H01L 21/288 | (2006.01) |

(52) U.S. Cl.
CPC ......... *H01P 1/2088* (2013.01); *H01L 21/288* (2013.01); *H01L 21/76802* (2013.01); *H01L 21/76874* (2013.01); *H01L 21/76879* (2013.01); *H01L 23/66* (2013.01); *H01P 1/2002* (2013.01); *H01P 3/16* (2013.01); *H01P 7/10* (2013.01); *H01P 11/006* (2013.01); *H01P 11/008* (2013.01); *H01L 2223/6627* (2013.01)

(58) Field of Classification Search
CPC ...... H01P 1/2088; H01P 11/00; H01P 11/008; H01P 3/122; H01P 3/16; H01P 7/10; H01P 1/2002
USPC .................................................. 333/208–212
See application file for complete search history.

(56) References Cited

U.S. PATENT DOCUMENTS

| | | | | |
|---|---|---|---|---|
| 2002/0008596 A1* | 1/2002 | Watanabe | ............... | H01P 1/387 333/1.1 |
| 2005/0136876 A1* | 6/2005 | Broholm | ............... | H01P 1/2053 455/307 |
| 2020/0066661 A1* | 2/2020 | Tschumakow | .......... | H01P 7/065 |

* cited by examiner

*Primary Examiner* — Rakesh B Patel
(74) *Attorney, Agent, or Firm* — Schwabe, Williamson & Wyatt, P.C.

(57) ABSTRACT

A filter structure comprises a first dielectric buildup film. A second dielectric buildup film is over the first dielectric buildup film, the second dielectric buildup film including a metallization catalyst. A trench is in the second dielectric buildup film. A metal is selectively plated to sidewalls of the trench based at least in part on the metallization catalyst. A low-loss buildup film is over the metal that substantially fills the trench.

21 Claims, 6 Drawing Sheets

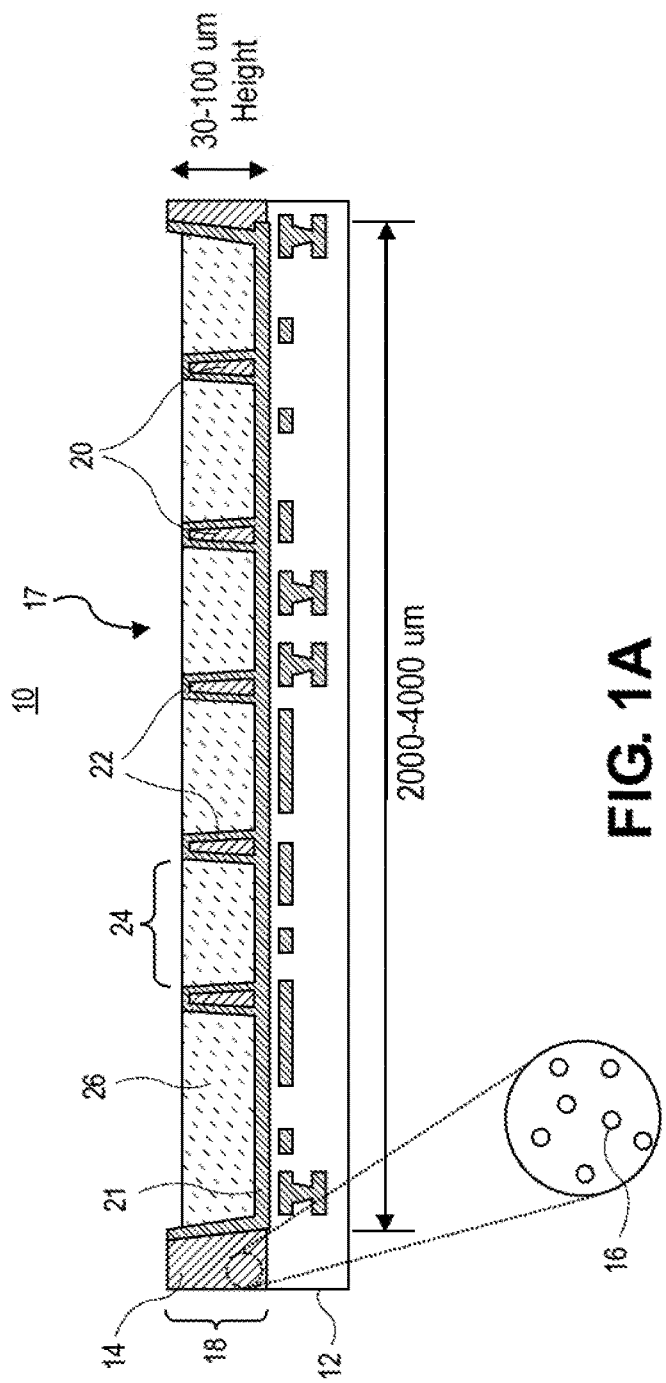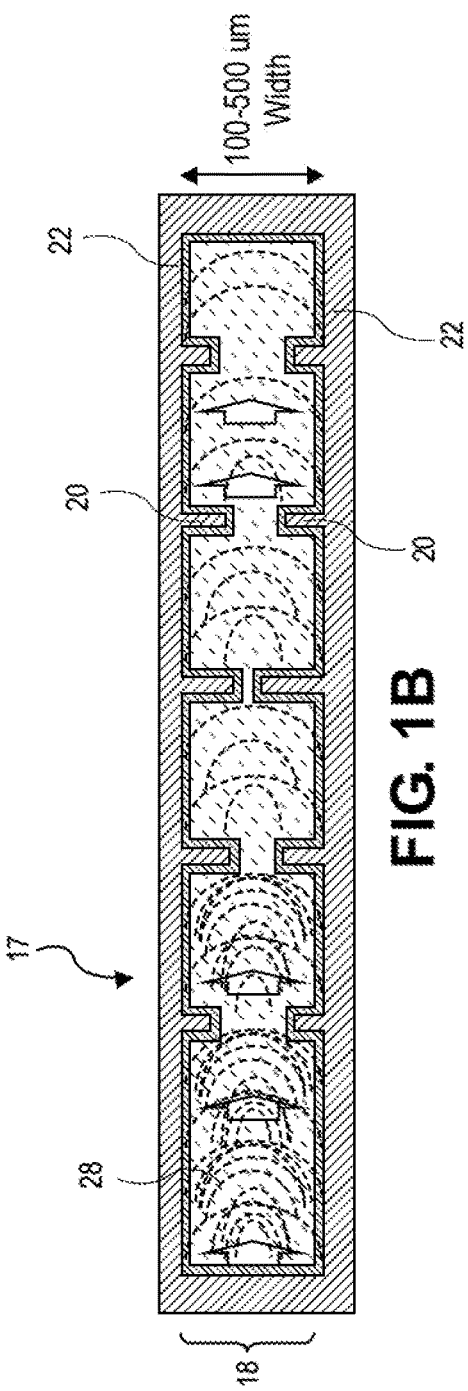
FIG. 1A
FIG. 1B

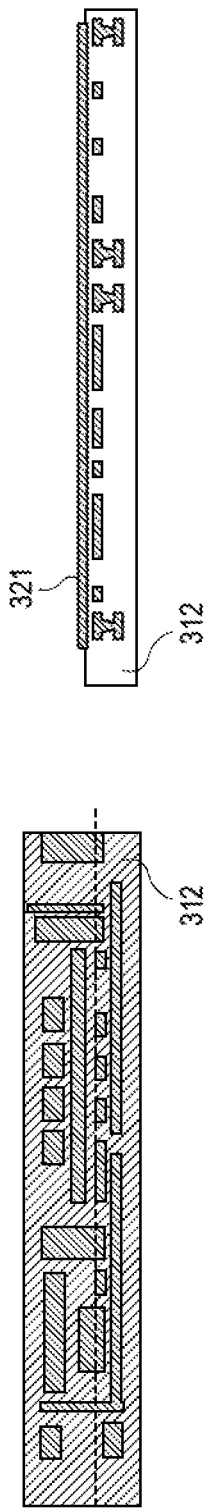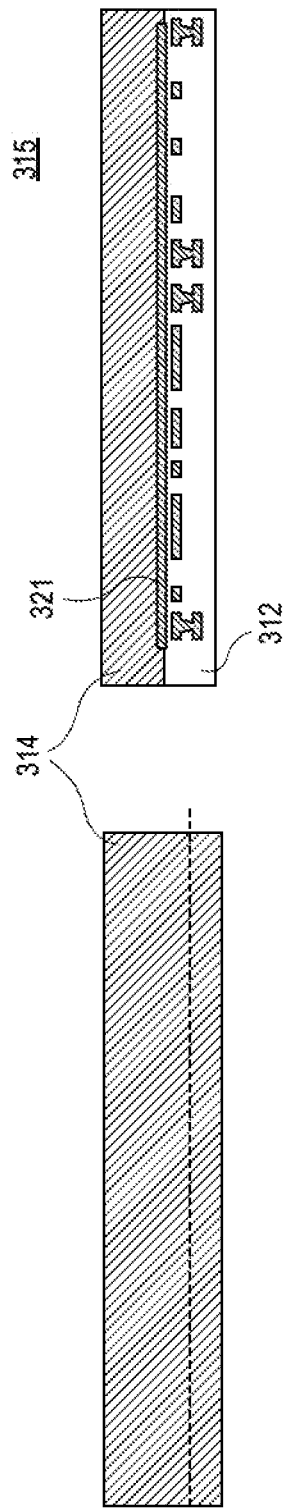
FIG. 3A
FIG. 3B

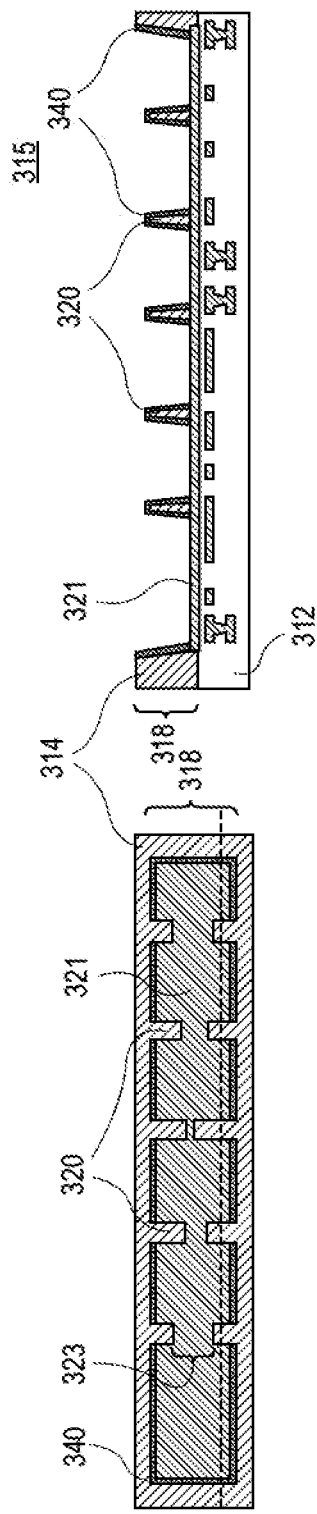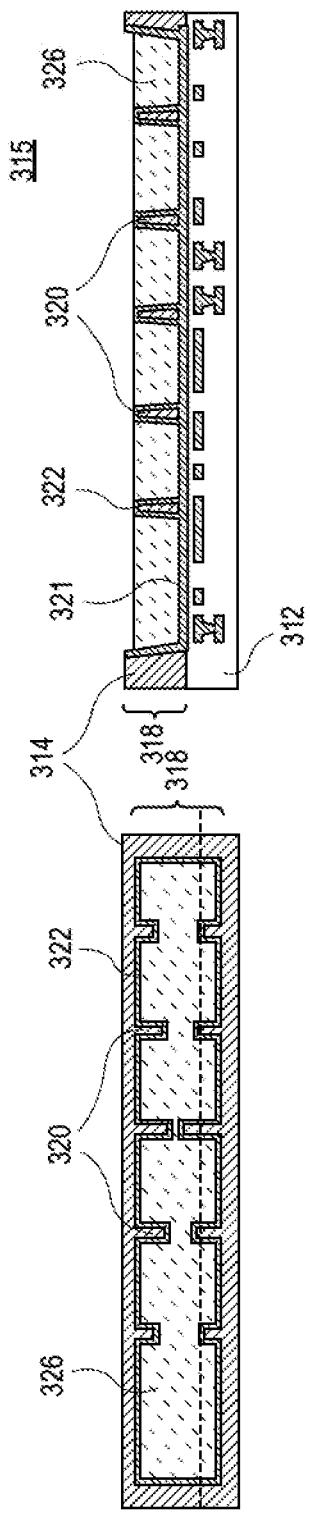

FABRICATING AN RF FILTER ON A SEMICONDUCTOR PACKAGE USING SELECTIVE SEEDING

TECHNICAL FIELD

Embodiments of the disclosure are in the field of integrated circuit structures and, in particular, fabricating an RF filter on a semiconductor package using selective seeding.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. The drive for ever-more capacity, however, is not without issue. The necessity to optimize the performance of each device becomes increasingly significant.

Radio frequency (RF) filters and amplifiers on a semiconductor package are necessary for 5G and millimeter wave applications. Thus, cheap, efficient, and innovative methods for embedding RF filters on a package are in high demand. Embedding RF filters into the substrate package has traditionally been done utilizing lithography and the traditional Semi-Additive Process (SAP).

Trace geometries are photolithography defined in the semi-additive process. Semi-additive PCB fabrication begins with a laminate that is clad with a thin copper film of 2 or 3 microns thick. The ultra-thin copper sheets have a backing that is removed after the foil is laminated to a substrate. Via holes are drilled and then an electroless copper bath coats the bores and the copper surface. A resist is applied, developed, and selectively removed to expose only the areas that will become traces, vias, and other conductive features. Those exposed areas are plated, the resist is removed, and the ultra-thin copper remaining in the spaces between the conductors is etched away.

The disadvantages of using SAP are manifold. One disadvantage is that traditional SAP uses up to eight dielectric buildup layers that are inherently lossy in terms of dielectric loss, which limits the efficiency of the RF filter/amplifier. Traditional SAP is extensive, complicated, and thus very costly as a large number of lithography steps are needed to form the pattern and the form factor is limited to design of substrate package. Lithography alignment error is a disadvantage that results in an undesirable jagged cavity wall shape of the RF filter. This leads to RF inefficiency, as it is desirable for the cavity walls to be flat to lower resistance at the interface of Cu and the resin. Yet another disadvantage of using SAP is poor copper thickness uniformity due to copper density offset between inside and outside of RF filter, which further affects the efficiency.

Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 1A and 1B are diagrams illustrating a cross-section and a top view of a semiconductor package substrate with an embedded filter structure in accordance with the disclosed embodiments.

FIGS. 3A-3D each illustrate a top view and a cross-sectional view of the process for fabricating the filter structure of FIGS. 1A and 1B.

DESCRIPTION OF THE EMBODIMENTS

Figure 2:
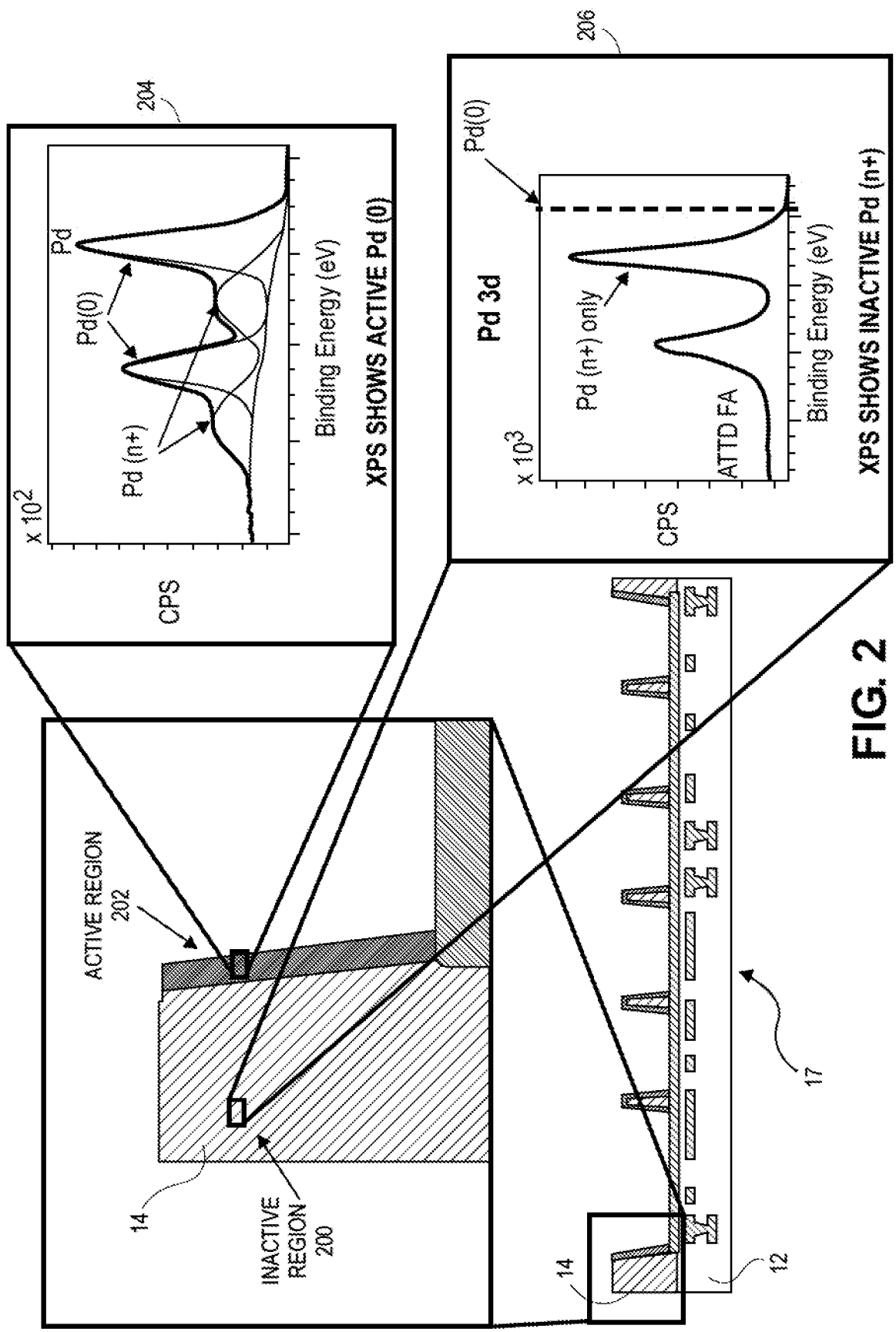
FIG. 2 illustrates a cross-sectional diagram and x-ray photoelectron spectroscopy (XPS) spectra graphs of the filter structure in an embodiment where the metallization catalyst in the second dielectric buildup film comprises palladium (Pd).

Fabricating an RF filter on a semiconductor package using selective seeding are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As described above, embedding RF filters into a substrate package has traditionally been done utilizing lithography and a semi-additive process (SAP) that uses up to eight dielectric buildup layers to create the RF filter. A main disadvantage of the SAP process is that the resulting RF filter retains the characteristics of the dielectric buildup layers, which are inherently lossy in terms of dielectric loss and decreases transmission efficiency.

One or more embodiments described herein are directed to structures and architectures for fabricating an RF filter on a semiconductor package using selective seeding. According to the disclosed embodiments, a dielectric buildup film containing an electroless catalyst is used to fabricate a filter structure, such as an RF filter/amplifier, by forming a trench in the dielectric buildup film with laser ablation, which also selectively activates sidewalls of the trench for electroless metal deposition or seeding. The trench sidewalls are metal plated by immersion in an electroless solution. The trench is then substantially filled with a low-loss dielectric buildup film of choice, thus improving efficiency and simplifying the process flow.

FIGS. 1A and 1B are diagrams illustrating a cross-section and a top view of a semiconductor package substrate with an embedded filter structure in accordance with the disclosed embodiments. In embodiments, the semiconductor package substrate 10 comprises a first dielectric buildup film 12 and a second dielectric buildup film 14 over the first dielectric buildup film 12, where the second dielectric buildup film 14 contains or includes a metallization catalyst 16.

In one embodiment, the second dielectric buildup film 14 may comprise any buildup polymer with silica filler. In embodiments, the second dielectric buildup film 14 may comprise a dielectric material that contains the metallization catalyst 16, where the dielectric material may comprise an epoxy-polymer blend dielectric material, silicon dioxide and silicon nitride, as well as a low-k and an ultra low-k dielectric (dielectric constants less than about 3.6), including but not limited to carbon catalyst-doped buildup films, fluorine catalyst-doped buildup films, porous dielectrics, organic polymeric dielectrics, silicon based polymeric dielectrics, and the like.

In one embodiment, the metallization catalyst 16 in the second dielectric buildup film 14 may be used to facilitate or allow selective electroless deposition of a metal on the semiconductor package substrate 10. In embodiments, the metallization catalyst 16 may comprise, but is not limited to, palladium (Pd), aluminum (Al), ruthenium (Ru), titanium (Ti), gold (Au), copper (Cu), silver (Ag), or cobalt (Co), for selective activation for electroless by laser ablation.

The filter structure 17 comprises a trench 18 with an optional plurality of fins 20 formed in the second dielectric buildup film 14 through laser ablation down to the metal pad 21. The fins 20 may be recessed within the trench 18 such that the fins 20 have a height below that of the trench walls. The fins 20 may be located along two opposing sidewalls of the trench 18, as seen in the top view of FIG. 1B. Opposing pairs of fins 20 protrude into the trench 18 with gaps of various distances therebetween that may range between 30 and 750 μm.

A metal 22 is plated on all the sidewalls 20 of the trench 18 and the surfaces of the fins 20 due at least in part on activation of the metallization catalyst 16 at an interface between the second dielectric buildup film 14 and the sidewalls of the trench 18 and fins 20 by the laser ablation and electroless deposition to form metal plated cavities 24 between laterally adjacent fins 20. In one specific embodiment, the metal used to plate the sidewalls of the trench 18 and the fins 20 may comprise Cu.

A remainder of the trench 18 is filled with a low-loss buildup film 26 that is formed on the metal 22, where the low-loss buildup film 26 has a dielectric loss that is significantly less than the dielectric loss of the first dielectric buildup film 12. For example, the dielectric loss tangent ($\varepsilon''/\varepsilon'$) of the low-loss buildup film 26 can range between 0.00005 and 0.01 whereas the dielectric loss of the first dielectric buildup film 12 can range between 0.01 and 1. In one embodiment, the low-loss buildup film 26 may comprise a polyperfluoralkyl polymer or a high-molecular weight cyclo-olefin polymer. In one embodiment, the filter structure 17 comprises an embedded RF filter, but in other embodiments, the filter structure 17 may be configured to comprise an RF amplifier, a waveguide, filter, or a resonator.

In embodiments, the filter structure 17 may be approximately 2000-4000 μm in length, approximately 30-100 μm in height, and approximately 100-500 μm in width. In some embodiments, the fins 20 may be recessed below the height of the second dielectric buildup film 14 by approximately 5-50 μm, for example. In one embodiment, the metal plated cavities 24 may be approximately 10-50 μm in length.

Referring to FIG. 1B, an example is shown of the filter structure operating as an RF filter. A signal 28 enters from the left side of the filter structure 17 and propagates from left to right through the trench 18 where the signal 28 is filtered by the fins 20. The spacing between laterally adjacent fins 20 in the X direction in FIG. 1A and between opposing sets of fins 20 in the Y direction in FIG. 1B controls what target signal frequency (e.g., between 10 and 500 Ghz) is transmitted as output from the RF filter. The periodicity of the fins 20 depends on the frequency/wavelength that the RF filter is targeting.

FIG. 2 illustrates a cross-sectional diagram and x-ray photoelectron spectroscopy (XPS) spectra graphs of the filter structure in an embodiment where the metallization catalyst in the second dielectric buildup film comprises palladium (Pd). The bottom of FIG. 2 shows the filter structure 17, including the second dielectric buildup film 14 over the first dielectric buildup film 12. An enlargement of a portion of the filter structure 17 shows that the second dielectric buildup film 14 comprises an inactive region 200 and an active region 202, where the active region is laser-activated during trench formation.

Accordingly, the second dielectric buildup film 14 can be identified by cross-sectioning and elemental analysis such as x-ray photoelectron spectroscopy (XPS) to detect dopants. The dopant in the second dielectric buildup film 14 is an electroless catalyst, which is a transition metal (summarized above) that is easy to detect because of its high atomic weight. An example dopant or metallization catalyst is palladium (Pd). Although the Pd dopant is homogeneously distributed throughout the second dielectric buildup film 14, it is catalytically inactive and will show up as ionic palladium of oxidation state n+ in an "inactive" region 200 of the second dielectric buildup film 14. Laser ablation will convert a portion of the Pd to metallic state of oxidation state "0" in an "active" region 202. Thus, the inactive region 200 and the active region 202 have distinctly different oxidation states.

XPS spectra graph 204 and 206 are shown, where the X-axis represents binding energy (eV) and the Y-axis represents electron volts. XPS spectra graph 206 (lower inset) shows content of the Pd in the inactive region 200, and XPS spectra graph 204 (top inset) shows the content of the Pd in the active region 202. XPS spectra graph 206 shows that the inactive region 200 contains ionic Pd (n+) only, which is not catalytically active for electroless deposition. XPS spectra graph 204 shows that the active region 202 contains both ionic Pd (n+) and Pd in oxidation state (0), where Pd (0) is catalytically active for electroless deposition. Notice that the peak for Pd (0) occurs at about 335 eV in XPS spectra graph 204, but the same peak for Pd (0) is not present in the XPS spectra graph 206. Not only does this show that catalyst, Pd, is present the active region 202, but also that the Pd is in different oxidation/activity states after being ablated by the laser. In addition, since the trench 18 of the RF filter is laser-drilled, it can be filled with a dielectric of choice. This dielectric fill can be a low-loss dielectric or other, which is also detectable using spectroscopy.

FIGS. 3A-3D each illustrate a top view and a cross-sectional view of the process for fabricating the filter structure of FIGS. 1A and 1B. FIG. 3A illustrates the fabrication process after the first dielectric buildup film 312 is formed and a metal pad 321 is formed on the surface of the first dielectric buildup film 312 to act at least in part as a stop for trench formation. According to various embodiments, the first dielectric buildup film 312 may include an epoxy-based polymer or a polyimide based polymer.

In some embodiments, the metal pad 321 may be deposited on the first dielectric buildup film 312 to facilitate masked selective patterning of a metal layer through electroless deposition. For example, the metal pad 321 may be disposed on first dielectric buildup film 312 to prevent electroless deposition of metal on the first dielectric buildup film 312 when depositing the metal layer. The metal pad 321 may be a permanent feature of the semiconductor package substrate in some embodiments. In some embodiments, the metal pad 321 comprises a same metal material as the metal used to plate sidewalls of the trench and fins. Accordingly, in one embodiment, the metal pad 321 comprises copper, but the metal pad 321 may be composed of other suitable materials in other embodiments. According to various embodiments, the metal pad 321 may have a thickness from approximately 1 micron to 5 microns in some embodiments. The metal pad 321 may be deposited using any suitable process.

FIG. 3B shows the process after the second dielectric buildup film 314 containing metallization catalyst is laminated onto the first dielectric buildup film 312 to form a semiconductor package substrate 315. According to various embodiments, the second dielectric buildup film 314 may include a dielectric material such as an epoxy material doped with particles of metallization catalyst, hereinafter referred to as catalyst-doped buildup film 314. The catalyst-doped buildup film 314 may include catalytic particles as described in connection with FIG. 1 in some embodiments. For example, in some embodiments, the catalyst-doped buildup film 314 may include a filler material. Although in some embodiments, the catalyst-doped buildup film 314 may be 30-100 μm in height, in one specific embodiment, the catalyst-doped buildup film 314 may be greater than 90 μm in height.

FIG. 3C shows the process after laser ablation is used to form a trench 318 through the catalyst-doped buildup film 314 down to and exposing the metal pad 321 for electroless metal deposition. As shown, the trench 318 is formed with a plurality of laterally spaced fins 320 on opposing trench sidewalls, where pairs of the fins 320 on the opposing trench sidewalls have variably sized gaps 323 therebetween. In embodiments where the catalyst-doped buildup film 314 includes metallization catalytic particles that are activated by laser light (e.g., a photo-activated filler material), the laser ablation may also simultaneously activate the metallization catalytic particles at an interface of the catalyst-doped buildup film 314 and the trench 318, forming an active layer 340 on semiconductor package substrate 315.

FIG. 3D shows the semiconductor package substrate 315 after being immersed in an electroless solution (not shown) resulting in selective deposition on the active layer 340. In one embodiment, the semiconductor package substrate 315 may be immersed in an electroless solution such as, for example, copper salt, reducing agent and pH mediator in aqueous media to allow selective metal deposition of a metal layer 322 (e.g., copper layer) on the active layer 340 within the trench of the semiconductor package substrate 315.

In other words, the metal layer 322 such as, for example, a copper layer may only be deposited or may be much more favorably deposited where the exposed metallization catalytic particles (e.g., activated catalytic particles) are disposed (e.g., in the trench). The exposed metallization catalytic particles may have a higher reaction rate, and may catalyze the deposition of the metal layer 322 from solution onto the semiconductor package substrate 315 resulting in selective patterning that may be bound by the precision of the ablating laser. In an optional embodiment, the metal layer 322 may be also disposed on the metal pad 321. The metal layer 322 can be thin, since only a small amount is needed to filter the RF signal within the trench. The metal layer 322 may be disposed on a surface of the trench sidewalls and fin sidewalls. At least one or more of the exposed metallization catalytic particles may be disposed at an interface between the second dielectric buildup film 314 and the metal layer 322 and may be debonded from the ligand by the laser light that formed the trench 318. In some embodiments, the metallization catalytic particles may be catalytically active when embedded in the second dielectric buildup film 314. For example, in some embodiments, the metal crystals may not be strongly bonded with a ligand or may not be bonded with a ligand at all.

Following plating by the metal layer 322, the trench 318 is filled with a low-loss buildup film 326, which has a dielectric loss that is significantly less than the dielectric loss of the first dielectric buildup film 312 to form a customized filter structure. Since the trench 318 is the volume that the RF waves will be propagating in, the ability to fill the trench 318 with low-loss dielectric, as opposed to using the second dielectric buildup film 314 or a generic buildup film, such as ABF, greatly increases the efficiency and efficacy of the RF filter. It should be noted that the laser-ablated trench may be filled with any type of dielectric to increases transmission efficiency or an exotic-index material to control mode volumes and reduce dimensions of the filter structure. In addition, traditional SAP could be used on the low-loss buildup film 326 to pattern the next layer Fabricating an RF filter on a semiconductor package using selective seeding provides many advantages. For example, selective seeding greatly reduces the number of steps needed to create the RF filter. Metallization of the trench walls is completed in fewer steps (2-layers) than current SAP methods that require up to seven (7) metal layers. Consequently, the price is of the RF filter is decreased.

A substantial z-height benefit is also gained using the disclosed embodiments, since only two layers are needed to create the filter structure. At mmWave frequency ranges, i.e. 30 GHz and above, lumped element filters are not available as the size of the individual components, e.g., resonators, inductors, and capacitors, represents a significant portion of the signal wavelength. In this case, filters become essentially waveguide/resonator structures such as the ones disclosed herein.

Figure 4:
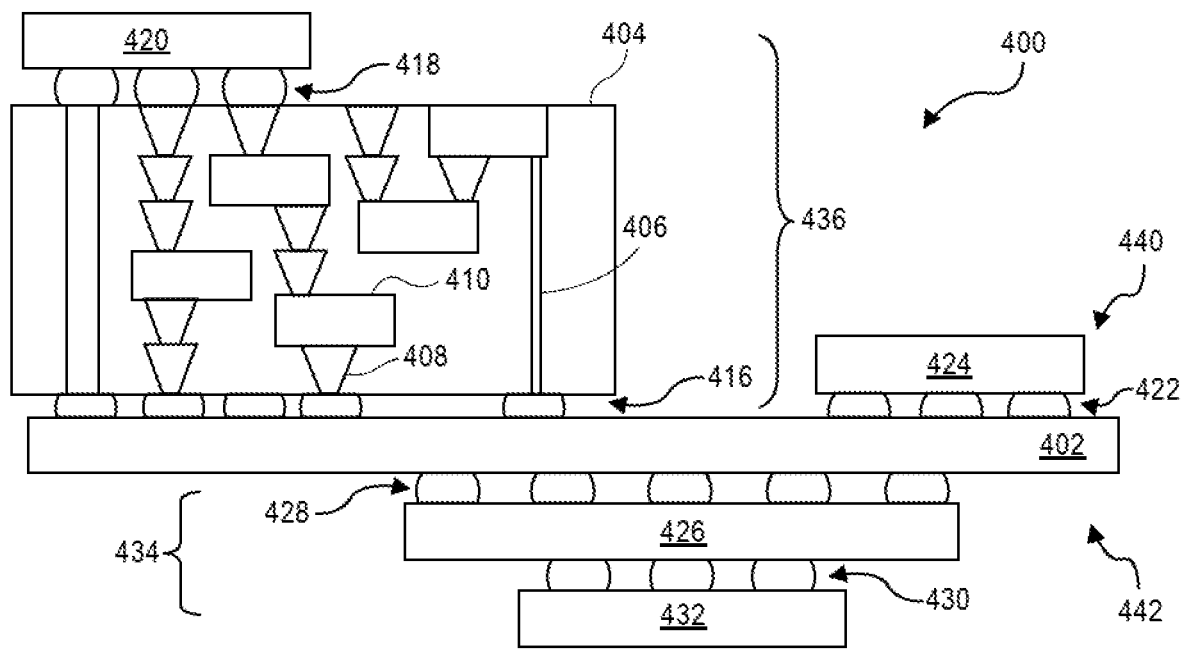
FIG. 4 is a cross-sectional side view of an integrated circuit (IC) device assembly that may include one or more RF filters fabricated on a semiconductor package using selective seeding, in accordance with one or more of the embodiments disclosed herein.

FIG. 4 is a cross-sectional side view of an integrated circuit (IC) device assembly that may include one or more RF filters fabricated on a semiconductor package using selective seeding, in accordance with one or more of the embodiments disclosed herein.

Referring to FIG. 4, an IC device assembly 400 includes components having one or more integrated circuit structures described herein. The IC device assembly 400 includes a number of components disposed on a circuit board 402 (which may be, e.g., a motherboard). The IC device assembly 400 includes components disposed on a first face 440 of the circuit board 402 and an opposing second face 442 of the circuit board 402. Generally, components may be disposed on one or both faces 440 and 442. In particular, any suitable ones of the components of the IC device assembly 400 may include a number of RF filters fabricated on a semiconductor package using selective seeding, such as disclosed herein.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a non-PCB substrate.

The IC device assembly 400 illustrated in FIG. 4 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 4), male and female portions of a socket, an adhesive, an underfill material, and/or any other suitable electrical and/or mechanical coupling structure.

The package-on-interposer structure 436 may include an IC package 420 coupled to an interposer 404 by coupling components 418. The coupling components 418 may take any suitable form for the application, such as the forms discussed above with reference to the coupling components 416. Although a single IC package 420 is shown in FIG. 4, multiple IC packages may be coupled to the interposer 404. It is to be appreciated that additional interposers may be coupled to the interposer 404. The interposer 404 may provide an intervening substrate used to bridge the circuit board 402 and the IC package 420. The IC package 420 may be or include, for example, a die or any other suitable component. Generally, the interposer 404 may spread a connection to a wider pitch or reroute a connection to a different connection. For example, the interposer 404 may couple the IC package 420 (e.g., a die) to a ball grid array (BGA) of the coupling components 416 for coupling to the circuit board 402. In the embodiment illustrated in FIG. 4, the IC package 420 and the circuit board 402 are attached to opposing sides of the interposer 404. In other embodiments, the IC package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some implementations, the interposer 404 may be formed of alternate rigid or flexible materials that may include the same materials described above for use in a semiconductor substrate, such as silicon, germanium, and other group III-V and group IV materials. The interposer 404 may include metal interconnects 410 and vias 408, including but not limited to through-silicon vias (TSVs) 406. The interposer 404 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The IC device assembly 400 may include an IC package 424 coupled to the first face 440 of the circuit board 402 by coupling components 422. The coupling components 422 may take the form of any of the embodiments discussed above with reference to the coupling components 416, and the IC package 424 may take the form of any of the embodiments discussed above with reference to the IC package 420.

The IC device assembly 400 illustrated in FIG. 4 includes a package-on-package structure 434 coupled to the second face 442 of the circuit board 402 by coupling components 428. The package-on-package structure 434 may include an IC package 426 and an IC package 432 coupled together by coupling components 430 such that the IC package 426 is disposed between the circuit board 402 and the IC package 432. The coupling components 428 and 430 may take the form of any of the embodiments of the coupling components 416 discussed above, and the IC packages 426 and 432 may take the form of any of the embodiments of the IC package 420 discussed above. The package-on-package structure 434 may be configured in accordance with any of the package-on-package structures known in the art.

Figure 5:
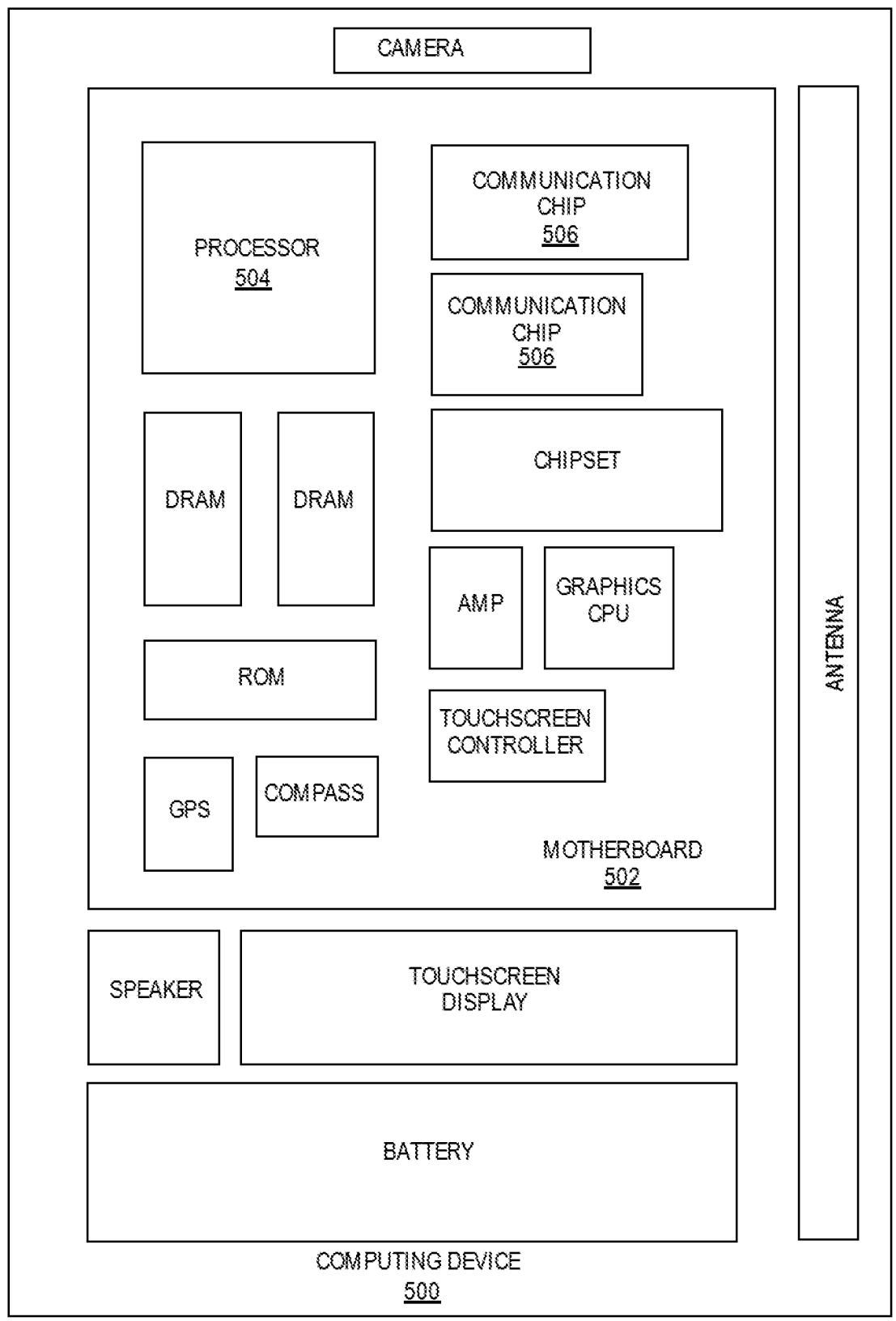
FIG. 5 illustrates a computing device in accordance with one implementation of the disclosure.

FIG. 5 illustrates a computing device 500 in accordance with one implementation of the disclosure. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the disclosure, the integrated circuit die of the processor includes one or more RF filters fabricated on a semiconductor package using selective seeding, in accordance with implementations of embodiments of the disclosure. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of embodiments of the disclosure, the integrated circuit die of the communication chip includes one or more RF filters fabricated on a semiconductor package using selective seeding, in accordance with implementations of embodiments of the disclosure.

In further implementations, another component housed within the computing device 500 may contain an integrated circuit die that includes one or more RF filters fabricated on a semiconductor package using selective seeding, in accordance with implementations of embodiments of the disclosure.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, embodiments described herein include RF filters fabricated on a semiconductor package using selective seeding.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A filter structure comprises a first dielectric buildup film. A second dielectric buildup film is over the first dielectric buildup film, the second dielectric buildup film including a metallization catalyst. A trench is in the second dielectric buildup film. A metal is selectively plated to sidewalls of the trench based at least in part on the metallization catalyst. A low-loss buildup film is over the metal that substantially fills the trench.

Example embodiment 2: The filter structure of example embodiment 1, wherein the metallization catalyst comprises one of: palladium (Pd), aluminum (Al), ruthenium (Ru), titanium (Ti), gold (Au), copper (Cu), silver (Ag), and cobalt (Co).

Example embodiment 3: The filter structure of embodiment 1 or 2, wherein the second dielectric buildup film comprises a dielectric material that contains the metallization catalyst, wherein the dielectric material comprises an epoxy-polymer blend dielectric material, silicon dioxide and silicon nitride, a low-k dielectric.

Example embodiment 4: The filter structure of embodiment 1, 2, or 3, wherein the low-loss buildup film comprises a buildup polymer with a silica filler.

Example embodiment 5: The filter structure of embodiment 1, 2, 3, or 4, wherein the trench further comprises: a plurality of fins located along opposing sidewalls of the trench, wherein the metal is plated to sidewalls of the fins to form metal plated cavities between laterally adjacent ones of the fins.

Example embodiment 6: The filter structure of embodiment 1, 2, 3, 4, or 5, wherein the fins are recessed within the trench such that the fins have a height below that of the trench sidewalls.

Example embodiment 7: The filter structure of embodiment 1, 2, 3, 4, 5, or 6, wherein the filter structure is approximately 2000-4000 μm in length.

Example embodiment 8: The filter structure of embodiment 1, 2, 3, 4, 5, 6, or 7, wherein the filter structure is approximately 30-100 μm in height.

Example embodiment 9: The filter structure of embodiment 1, 2, 3, 4, 5, 6, 7, or 8, wherein the filter structure is approximately 100-500 μm in width.

Example embodiment 10: The filter structure of embodiment 1, 3, 4, 5, 6, 7, 8, or 9, wherein the metallization catalyst in the second dielectric buildup film comprises palladium (Pd), and wherein the second dielectric buildup film further includes an inactive region and an active region, where the inactive region contains ionic Pd (n+), while the active region contains both contains ionic Pd (n+) and Pd in oxidation state (0).

Example embodiment 11: The filter structure of embodiment 1, 2, 3, 4, 5, 6, 7, 8, 9, or 10, wherein the filter structure comprises one of: an RF filter, an RF amplifier, a waveguide, and a resonator.

Example embodiment 12: An RF filter structure comprises a first dielectric buildup film and a metal pad on the first dielectric buildup film. A second dielectric buildup film is laminated to the metal pad, wherein the second dielectric buildup film includes a metallization catalyst. A trench is in the second dielectric buildup film down to the metal pad, wherein the trench includes a plurality of laterally spaced fins on two opposing trench sidewalls, where pairs of the fins on the opposing trench sidewalls have variably sized gaps therebetween. A metal selectively plated to the trench sidewalls and sidewalls of the fins based at least in part on activation of the metallization catalyst at an interface between the second dielectric buildup film and the sidewalls of the trench and fins. A low-loss buildup film is over the metal that substantially fills the trench.

Example embodiment 13: The RF filter structure of embodiment 12, wherein the metallization catalyst comprises one of: palladium (Pd), aluminum (Al), ruthenium (Ru), titanium (Ti), gold (Au), copper (Cu), silver (Ag), and cobalt (Co).

Example embodiment 14: The RF filter structure of embodiment 12 or 13, wherein the low-loss buildup film comprises a buildup polymer with a silica filler.

Example embodiment 15: The RF filter structure of embodiment 12, 13 or 14, wherein the trench further comprises: a plurality of fins located along opposing sidewalls of the trench, wherein the metal is plated to sidewalls of the fins to form metal plated cavities between laterally adjacent ones of the fins.

Example embodiment 16: The RF filter structure of embodiment 12, 13, 14, or 15, wherein the fins are recessed within the trench such that the fins have a height below that of the trench sidewalls.

Example embodiment 17: The RF filter structure of embodiment 12, 13, 14, 15, or 16, wherein the filter structure is approximately 2000-4000 μm in length.

Example embodiment 18: The RF filter structure of embodiment 12, 13, 14, 15, 16, or 17, wherein the filter structure is approximately 30-100 μm in height.

Example embodiment 19: The RF filter structure of embodiment 12, 13, 14, 15, 16, 17, or 18, wherein the filter structure is approximately 100-500 μm in width.

Example embodiment 20: The RF filter structure of embodiment 12, 13, 14, 15, 16, 17, 18, or 19, wherein the metallization catalyst in the second dielectric buildup film comprises palladium (Pd), and wherein the second dielectric buildup film further includes an inactive region and an active region, where the inactive region contains ionic Pd (n+), while the active region contains both contains ionic Pd (n+) and Pd in oxidation state (0).

Example embodiment 21: A method of fabricating an RF filter on a semiconductor package comprises forming a first dielectric buildup film. A second dielectric buildup film is formed over the first dielectric buildup film, the second dielectric buildup film including a metallization catalyst. A trench is formed in the second dielectric buildup film with laser ablation, wherein the laser ablation selectively activates sidewalls of the trench for electroless metal deposition. A metal is selectively plated to sidewalls of the trench based at least in part on the metallization catalyst and immersion in an electroless solution. A low-loss buildup film is over the metal that substantially fills the trench.

Example embodiment 22: The method of embodiment 21, further comprising: forming a metal pad on the surface of the first dielectric buildup film, prior to forming a second dielectric buildup film.

Example embodiment 23: The method of embodiment 21 or 22, further comprising: forming the trench in the second dielectric buildup film down to the metal pad.

Example embodiment 24: The method of embodiment 21, 22, or 23, further comprising: forming a plurality of laterally spaced fins on opposing trench sidewalls, such that pairs of the fins on the opposing trench sidewalls have variably sized gaps therebetween.

Example embodiment 25: The method of embodiment 21, 22, 23, or 24, further comprising: forming a low-loss buildup film such that the low-loss buildup film has a dielectric loss that is significantly less than a dielectric loss of the first dielectric buildup film to form a customized filter structure.

What is claimed is:
1. A filter structure, comprising:
a first dielectric buildup film;
a second dielectric buildup film over the first dielectric buildup film, the second dielectric buildup film comprising a dielectric material that contains a metallization catalyst, wherein the dielectric material comprises one of an epoxy-polymer blend dielectric material, silicon dioxide and silicon nitride, and a low-k dielectric;
a trench in the second dielectric buildup film;
a metal selectively plated to sidewalls of the trench based at least in part on the metallization catalyst; and
a low-loss buildup film over the metal that substantially fills the trench.

2. The filter structure of claim 1, wherein the metallization catalyst comprises one of: palladium (Pd), aluminum (Al), ruthenium (Ru), titanium (Ti), gold (Au), copper (Cu), silver (Ag), and cobalt (Co).

3. The filter structure of claim 1, wherein the filter structure comprises one of: an RF filter, an RF amplifier, a waveguide, and a resonator.

4. The filter structure of claim 1, wherein the low-loss buildup film comprises a buildup polymer with a silica filler.

5. The filter structure of claim 1, wherein the trench further comprises: a plurality of fins located along opposing sidewalls of the trench, wherein the metal is plated to sidewalls of the fins to form metal plated cavities between laterally adjacent ones of the fins.

6. The filter structure of claim 1, wherein a plurality of fins are recessed within the trench such that the plurality of fins have a height below that of sidewalls of the trench.

7. The filter structure of claim 1, wherein the filter structure is approximately 2000-4000 μm in length.

8. The filter structure of claim 1, wherein the filter structure is approximately 30-100 μm in height.

9. The filter structure of claim 1, wherein the filter structure is approximately 100-500 μm in width.

10. The filter structure of claim 1, wherein the metallization catalyst in the second dielectric buildup film comprises palladium (Pd), and wherein the second dielectric buildup film further includes an inactive region and an active region, where the inactive region contains ionic Pd (n+), while the active region contains both contains ionic Pd (n+) and Pd in oxidation state (0).

11. A filter structure, comprising:
a first dielectric buildup film;
a second dielectric buildup film over the first dielectric buildup film, the second dielectric buildup film including a metallization catalyst;
a trench in the second dielectric buildup film, wherein the trench further comprises a plurality of fins located along opposing sidewalls of the trench, wherein the metal is plated to sidewalls of the fins to form metal plated cavities between laterally adjacent ones of the fins;
a metal selectively plated to sidewalls of the trench based at least in part on the metallization catalyst; and
a low-loss buildup film over the metal that substantially fills the trench.

12. An RF filter structure, comprising:
a first dielectric buildup film;
a metal pad on the first dielectric buildup film;
a second dielectric buildup film laminated to the metal pad, the second dielectric buildup film including a metallization catalyst;
a trench in the second dielectric buildup film down to the metal pad, wherein the trench includes a plurality of laterally spaced fins on two opposing trench sidewalls, where pairs of the fins on the opposing trench sidewalls have variably sized gaps therebetween;
a metal selectively plated to the trench sidewalls and sidewalls of the fins based at least in part on activation of the metallization catalyst at an interface between the second dielectric buildup film and the sidewalls of the trench and fins; and
a low-loss buildup film over the metal that substantially fills the trench.

13. The RF filter structure of claim 12, wherein the metallization catalyst comprises one of: palladium (Pd), aluminum (Al), ruthenium (Ru), titanium (Ti), gold (Au), copper (Cu), silver (Ag), and cobalt (Co).

14. The RF filter structure of claim 12, wherein the low-loss buildup film comprises a buildup polymer with a silica filler.

15. The RF filter structure of claim 12, wherein the metal is plated to sidewalls of the trench and the plurality of laterally spaced fins to form metal plated cavities between laterally adjacent ones of the plurality of laterally spaced fins.

16. The RF filter structure of claim 12, wherein the fins are recessed within the trench such that the fins have a height below that of the trench sidewalls.

17. The RF filter structure of claim 12, wherein the RF filter structure is approximately 2000-4000 µm in length.

18. The RF filter structure of claim 12, wherein the RF filter structure is approximately 30-100 µm in height.

19. The RF filter structure of claim 12, wherein the RF filter structure is approximately 100-500 µm in width.

20. The RF filter structure of claim 12, wherein the metallization catalyst in the second dielectric buildup film comprises palladium (Pd), and wherein the second dielectric buildup film further includes an inactive region and an active region, where the inactive region contains ionic Pd (n+), while the active region contains both contains ionic Pd (n+) and Pd in oxidation state (0).

21. A filter structure, comprising:
a first dielectric buildup film;
a second dielectric buildup film over the first dielectric buildup film, the second dielectric buildup film including a metallization catalyst;
a trench in the second dielectric buildup film;
a plurality of fins recessed within the trench such that the plurality of fins have a height below that of sidewalls of the trench;
a metal selectively plated to sidewalls of the trench based at least in part on the metallization catalyst; and
a low-loss buildup film over the metal that substantially fills the trench.

* * * * *